US009865989B2

(12) United States Patent
Ishaug

(10) Patent No.: US 9,865,989 B2
(45) Date of Patent: Jan. 9, 2018

(54) COMPENSATION OF DISTORTION FROM SBS/IIN SUPPRESSION MODULATION

(75) Inventor: Brian Ishaug, Pleasanton, CA (US)

(73) Assignee: ARRIS Enterprises LLC, Suwanee, GA (US)

( * ) Notice: Subject to any disclaimer, the term of this patent is extended or adjusted under 35 U.S.C. 154(b) by 0 days.

(21) Appl. No.: 13/066,708

(22) Filed: Apr. 21, 2011

(65) Prior Publication Data
US 2011/0262144 A1 Oct. 27, 2011

Related U.S. Application Data

(60) Provisional application No. 61/342,896, filed on Apr. 21, 2010, provisional application No. 61/342,897, filed on Apr. 21, 2010.

(51) Int. Cl.
H04B 10/00 (2013.01)
H01S 5/062 (2006.01)
(Continued)

(52) U.S. Cl.
CPC ..... H01S 5/06213 (2013.01); H04B 10/2537 (2013.01); H01S 5/0427 (2013.01);
(Continued)

(58) Field of Classification Search
USPC .................................................. 398/192–199
See application file for complete search history.

(56) References Cited

U.S. PATENT DOCUMENTS 5,204,640 A * 4/1993 Logan, Jr. ................ H03L 1/00
331/25
5,420,868 A * 5/1995 Chraplyvy ......... H04B 10/2537
359/238

(Continued)

OTHER PUBLICATIONS

International Search Report and the Written Opinion of the International Searching Authority from PCT/US2011/000714, dated Dec. 27, 2011.
International Search Report and the Written Opinion of the International Searching Authority from PCT/US2011/000820, dated Dec. 21, 2011.
Yuzo Yoshikune and George Motosugi, "Multielectrode Distribuited Feedback Laser for Pure Frequency Modulation and Chirping Suppressed Amplitude Modulation, Journal of Lightwave Technology", Apr. 1987, No. 4.

Primary Examiner — Agustin Bello
(74) Attorney, Agent, or Firm — Thomas A. Ward

(57) ABSTRACT

A method includes modulating a laser that is coupled to a fiber; modulating the laser with a member selected from the group consisting of low frequency thermal modulation or bias modulation to broaden a laser linewidth, increase an SBS threshold and reduce an IIN; and modulating the laser with a predistorting modulation selected from the group consisting of phase modulation or amplitude modulation, the predistorting modulation being of equal magnitude but opposite phase as that produced in at least one member selected from the group consisting of the laser or the fiber as a result of the low frequency thermal modulation or bias modulation. An apparatus includes a laser; and a fiber coupled to the laser, wherein the laser is i) modulated ii) modulated with a member selected from the group consisting of low frequency thermal modulation or bias modulation to broaden a laser linewidth, increase an SBS threshold and reduce an IIN and iii) modulated with a predistorting modulation selected from the group consisting of phase modulation or amplitude modulation, the predistorting modulation being of equal magnitude but opposite phase as that produced in at least one member selected from the group consisting of the laser or the fiber as a result of the low frequency thermal modulation or bias modulation.

12 Claims, 2 Drawing Sheets

(51) Int. Cl.
*H04B 10/2537* (2013.01)
*H01S 5/042* (2006.01)

(52) U.S. Cl.
CPC ......... *H01S 5/0622* (2013.01); *H01S 5/06246* (2013.01); *H01S 2301/03* (2013.01)

(56) References Cited

U.S. PATENT DOCUMENTS

| | | | | |
|---|---|---|---|---|
| 5,515,196 A * | 5/1996 | Kitajima | ................ | B82Y 20/00 372/26 |
| 5,550,667 A * | 8/1996 | Krimmel | ............ | H04B 10/2537 398/193 |
| 5,671,075 A * | 9/1997 | Ramachandran | .. | H04B 10/2912 372/96 |
| 5,828,477 A * | 10/1998 | Nilsson | .............. | H04B 10/2537 398/185 |
| 5,892,607 A * | 4/1999 | Atlas | .................. | H04B 10/2537 359/279 |
| 5,930,024 A * | 7/1999 | Atlas | .................. | H04B 10/2537 359/279 |
| 5,973,812 A | 10/1999 | Imai et al. | | |
| 6,072,618 A * | 6/2000 | Takenaka | ........... | H04B 10/2537 359/239 |
| 6,204,951 B1 * | 3/2001 | Coward | .................. | G02F 1/225 359/245 |
| 6,229,631 B1 * | 5/2001 | Sato | .................. | H04B 10/0775 398/147 |
| 6,252,693 B1 * | 6/2001 | Blauvelt | ............ | H04B 10/2537 398/163 |
| 6,535,315 B1 * | 3/2003 | Way | ................... | H04B 10/2537 398/182 |
| 6,813,448 B1 * | 11/2004 | Chiappetta | ......... | H04B 10/2537 398/147 |
| 7,146,110 B2 * | 12/2006 | Frederiksen, Jr. | . | H04B 10/2537 398/193 |
| 7,349,637 B1 * | 3/2008 | Frederiksen, Jr. | . | H04B 10/2537 398/193 |
| 7,936,997 B2 * | 5/2011 | Ramachandran | | H04B 10/25751 398/192 |
| 7,974,319 B2 * | 7/2011 | Deladurantaye | .... | H01S 3/06754 372/26 |
| 8,340,531 B2 * | 12/2012 | Wang | ................. | H04B 10/2537 398/159 |
| 2003/0076567 A1 * | 4/2003 | Matthews | ........... | H04B 10/505 398/183 |
| 2004/0105470 A1 | 6/2004 | Bond | | |
| 2004/0156643 A1 * | 8/2004 | Frederiksen, Jr. | . | H04B 10/2537 398/192 |
| 2006/0188267 A1 * | 8/2006 | Gavrilovic | ......... | H04B 10/2537 398/188 |
| 2006/0251425 A1 * | 11/2006 | Kupershmidt | ........ | G02B 6/022 398/147 |
| 2008/0273874 A1 * | 11/2008 | Ramachandran | | H04B 10/25751 398/43 |
| 2011/0262144 A1 * | 10/2011 | Ishaug | ................ | H01S 5/06213 398/115 |

* cited by examiner

COMPENSATION OF DISTORTION FROM SBS/IIN SUPPRESSION MODULATION

CROSS-REFERENCES TO RELATED APPLICATIONS

This application claims a benefit of priority under 35 U.S.C. 119(e) from provisional patent applications U.S. Ser. No. 61/342,896, filed Apr. 21, 2010 and U.S. Ser. No. 61/342,897, filed Apr. 21, 2010 the entire contents of both of which are hereby expressly incorporated herein by reference for all purposes.

BACKGROUND INFORMATION

Field of the Invention

Embodiments of the invention relate generally to the field of optical communications. More particularly, an embodiment of the invention relates to compensation of distortion from SBS/IIN suppression modulation.

Discussion of the Related Art

Directly modulated lasers are commonly used in hybrid fiber-coax systems to transmit RF signals over long distances using optical fibers. These lasers are usually single mode and operate at wavelengths near 1310 nm or 1550 nm. The advantage of 1310 nm is most installed fiber has zero dispersion around this wavelength. Zero dispersion is important because the wavelength of directly modulated lasers fluctuates or chirps with modulation. This can lead to non-linear transmission effects if fiber dispersion is not zero.

The advantage of 1550 nm is most installed fiber has minimum loss around this wavelength. So 1550 nm can be used to transmit signals over longer distances than 1310 nm. In addition, the non-zero dispersion that most installed fiber exhibits around 1550 nm helps mitigate four wave mixing effect, allowing 1550 nm to be more easily used for wavelength division multiplexing. However, the non-zero dispersion interacts with laser chirp to produce intermodulation distortion of the transmitted signal. One way to mitigate the effects of chirp-dispersion induced distortion is to reduce the chirp of the optical source. Directly modulated optical sources with low chirp include, but are not limited to, special low chirp DFB lasers as well as external cavity lasers.

Reducing chirp too much or under-modulating the laser can lead to an increase in noise and distortion from SBS and/or IIN effects. To help compensate for this, a low frequency SBS/IIN suppression modulation can be added to the laser. This can be in the form of a bias modulation and/or a thermal modulation. A thermal modulation is preferred because it will not decrease clipping margin. However, obtaining a fast thermal modulation can be difficult. Therefore, a low frequency bias modulation may be more practical. Fortunately, a low frequency bias modulation will produce a similar effect as thermal modulation. The chirp from low frequency modulation is typically dominated by thermal effects caused by junction heating and will provide a much larger increase in laser linewidth than can be achieved for the same modulation amplitude at RF frequencies. So a significant increase in linewidth can be obtained with only a small decrease in clipping margin.

Various predistortion schemes have been proposed to compensate for intermodulation distortion caused by chirp-dispersion interaction of the transmitted RF signal. These schemes all involve compensation of only intermodulation products of the RF signal to be transmitter i.e. distortion products of the RF signal mixing with itself. The purpose of this invention is to provide means compensate for intermodulation products of the RF signal mixed with a low frequency SBS/IIN suppression signal whether it be from thermal or bias modulation of the optical source.

SUMMARY OF THE INVENTION

There is a need for the following embodiments of the invention. Of course, the invention is not limited to these embodiments.

According to an embodiment of the invention, a process comprises: modulating a laser that is coupled to a fiber; modulating the laser with a member selected from the group consisting of low frequency thermal modulation or bias modulation to broaden a laser linewidth, increase an SBS threshold and reduce an IIN; and modulating the laser with a predistorting modulation selected from the group consisting of phase modulation or amplitude modulation, the predistorting modulation being of equal magnitude but opposite phase as that produced in at least one member selected from the group consisting of the laser or the fiber as a result of the low frequency thermal modulation or bias modulation. According to another embodiment of the invention, a machine comprises: a laser; and a fiber coupled to the laser, wherein the laser is i) modulated ii) modulated with a member selected from the group consisting of low frequency thermal modulation or bias modulation to broaden a laser linewidth, increase an SBS threshold and reduce an IIN and iii) modulated with a predistorting modulation selected from the group consisting of phase modulation or amplitude modulation, the predistorting modulation being of equal magnitude but opposite phase as that produced in at least one member selected from the group consisting of the laser or the fiber as a result of the low frequency thermal modulation or bias modulation.

These, and other, embodiments of the invention will be better appreciated and understood when considered in conjunction with the following description and the accompanying drawings. It should be understood, however, that the following description, while indicating various embodiments of the invention and numerous specific details thereof, is given for the purpose of illustration and does not imply limitation. Many substitutions, modifications, additions and/or rearrangements may be made within the scope of an embodiment of the invention without departing from the spirit thereof, and embodiments of the invention include all such substitutions, modifications, additions and/or rearrangements.

BRIEF DESCRIPTION OF THE DRAWINGS

The drawings accompanying and forming part of this specification are included to depict certain embodiments of the invention. A clearer concept of embodiments of the invention, and of components combinable with embodiments of the invention, and operation of systems provided with embodiments of the invention, will be readily apparent by referring to the exemplary, and therefore nonlimiting, embodiments illustrated in the drawings (wherein identical reference numerals (if they occur in more than one view) designate the same elements). Embodiments of the invention may be better understood by reference to one or more of these drawings in combination with the following description presented herein. It should be noted that the features illustrated in the drawings are not necessarily drawn to scale.

DESCRIPTION OF PREFERRED EMBODIMENTS

Embodiments of the invention and the various features and advantageous details thereof are explained more fully with reference to the nonlimiting embodiments that are illustrated in the accompanying drawings and detailed in the following description. Descriptions of well known starting materials, processing techniques, components and equipment are omitted so as not to unnecessarily obscure the embodiments of the invention in detail. It should be understood, however, that the detailed description and the specific examples, while indicating preferred embodiments of the invention, are given by way of illustration only and not by way of limitation. Various substitutions, modifications, additions and/or rearrangements within the spirit and/or scope of the underlying inventive concept will become apparent to those skilled in the art from this disclosure.

Within this application one or more publications is(are) referenced by Arabic numeral(s), within parentheses or brackets. The disclosure(s) of this(these) publication(s) in its(their) entireties is(are) hereby expressly incorporated by reference herein for the purpose of indicating the background of embodiments of the invention and illustrating the state of the art.

A low frequency thermal and/or bias modulation can be added to a directly modulated laser to broaden the laser linewidth, increasing the SBS threshold and reducing IIN. However, this modulation can create intermodulation distortion products with the transmitted RF signal. The distortion can come from a variety of sources including, but not limited to, chirp-dispersion interaction in the fiber and thermal modulation of the laser slope efficiency. Chirp-dispersion interaction can result in phase modulation of the transmitted RF signal while thermal modulation of the laser slope efficiency modulation can result in amplitude modulation. Adding a predistorting phase and/or amplitude modulation of equal magnitude but opposite phase as that produced in the fiber and/or laser as a result of the SBS/IIN suppression modulation can reduce or eliminate this distortion.

Figure 1:
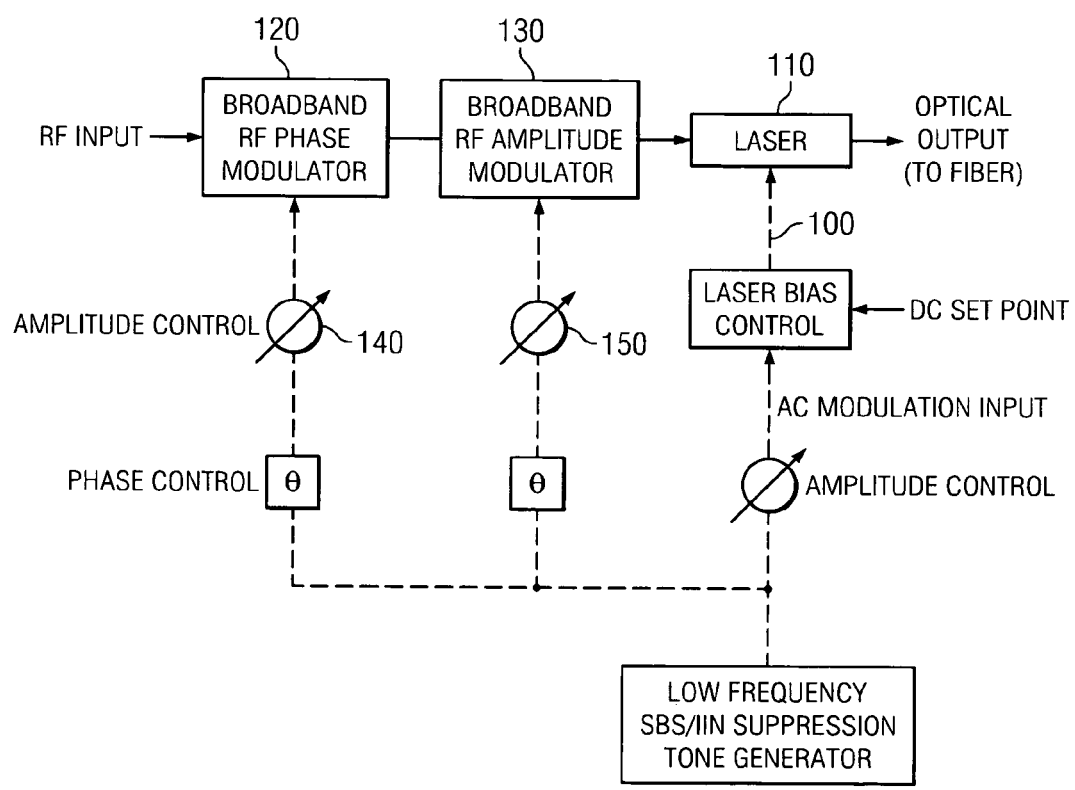
FIG. 1 is a schematic view of an exemplary transmitter with phase and amplitude modulator for compensating, representing an embodiment of the invention.

FIG. 1 shows a block diagram of an exemplary transmitter incorporating predistortion hardware, firmware and/or software to compensate for a low frequency SBS/IIN suppressing modulation. In this particularly implementation, the SBS/IIN suppressing modulation is in the form of a bias modulation. The DC bias with superimposed low frequency modulation is shown as a separate input 100 to the laser 110 because directly modulated laser typically incorporate an internal bias T (not shown). However, it should be noted that there are multiple ways in which a low frequency modulation can be added to the laser and someone skilled in the art will realize that many suitable combiners can be used to combine the RF signal with the DC bias and low frequency modulation.

In the event the low frequency SBS/IIN suppression modulation is a thermal modulation, the signal would be added to the thermal source connected to the laser and in close thermal contact with the laser. This thermal source could be in the form of a resistive heater, a thermo-electric cooler or some other appropriate means to provide a thermal modulation of the laser resulting in a wavelength modulation.

The same signal used to provide the low frequency bias or thermal modulation also drives predistortion circuits. The block diagram of FIG. 1 shows separate phase modulation and amplitude modulation predistortion circuits 120, 130. This is only an exemplary arrangement. The predistortion circuits can also be arranged in such a manner that a single circuit provides primarily phase, primarily amplitude and/or a combination of phase and amplitude modulation predistortion. It can also be arranged in such a manner that multiple circuits connected in series provide phase, amplitude and frequency dependent predistortion. Also, the low frequency input is shown as a separate input to the predistortion circuit, however it is also possible to feed the signal into the same input as the RF input by appropriately combining the RF signal with the low frequency modulation. In such cases, the same distortion generators used to provide predistortion of RF intermodulation distortion can also provide predistortion of the low frequency intermodulation distortion products i.e. distortion produced when the low frequency is mixed with RF frequencies.

Amplitude and phase adjust controls 150, 140 are provided for the low frequency input to the predistortion generators so the intermodulation products produced from the generators will have the same magnitude but opposite phase as that produced in the laser and/or after transmission over fiber. These controls may be fixed by design or adjustable by manual or automatic controls. In the event the magnitude and/or phase of distortion varies from transmitter to transmitter or from installation to installations, the magnitude and/or phase of the low frequency signal driving the predistortion generator can be adjustable. In the event the magnitude and/or phase of the distortion does not change from transmitter to transmitter or installation to installation, the magnitude and/or phase may be fixed by design. In some cases, the magnitude and/or phase may depend upon installation parameters such as fiber length. In such cases, the magnitude and/or phase may be best controlled by automatic means, such as with a microprocessor, in response to user parameter input such as fiber length.

Figure 2:
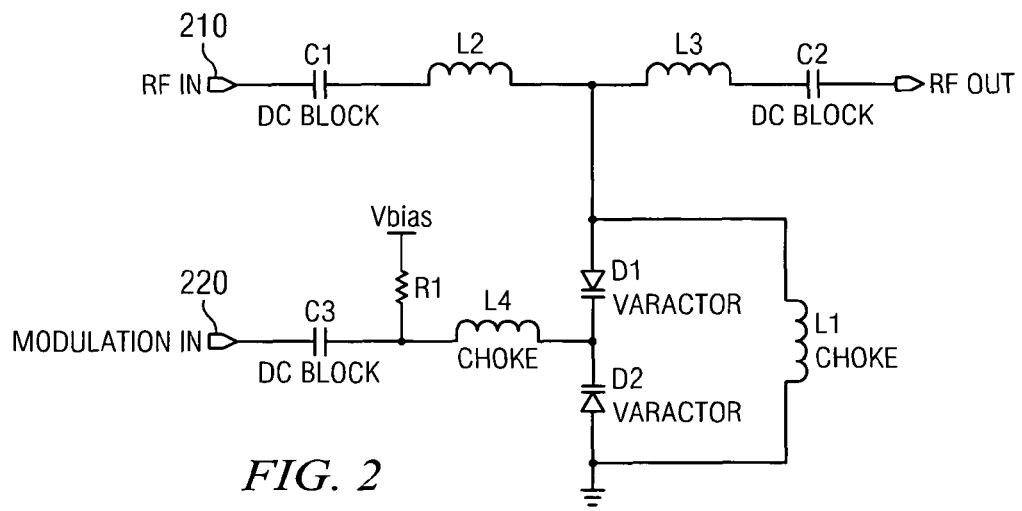
FIG. 2 is a schematic view of an exemplary broadband phase modulator, representing an embodiment of the invention.

FIG. 2 shows a simplified version of an exemplary broadband phase modulator in which the RF input 210 and the low frequency modulation input 220 are separate. This circuit is a modified version of a loaded line phase shifter in which the load is a pair of varactors D1, D2. The back to back nature of the varactors relative to the RF signal will minimize capacitance changes due to RF modulation and therefore minimize intermodulation distortion from the RF signal. The parallel nature of varactors relative to the low frequency modulation input will allow capacitance changes and therefore produce phase modulation. With appropriate choice of component values, this circuit can provide primarily phase modulation of the RF signal by a signal applied to the modulation input. As phase modulation is a characteristic of chirp interacting with fiber dispersion, this circuit can be useful to compensate for chirp-dispersion induced distortion.

Figure 3:
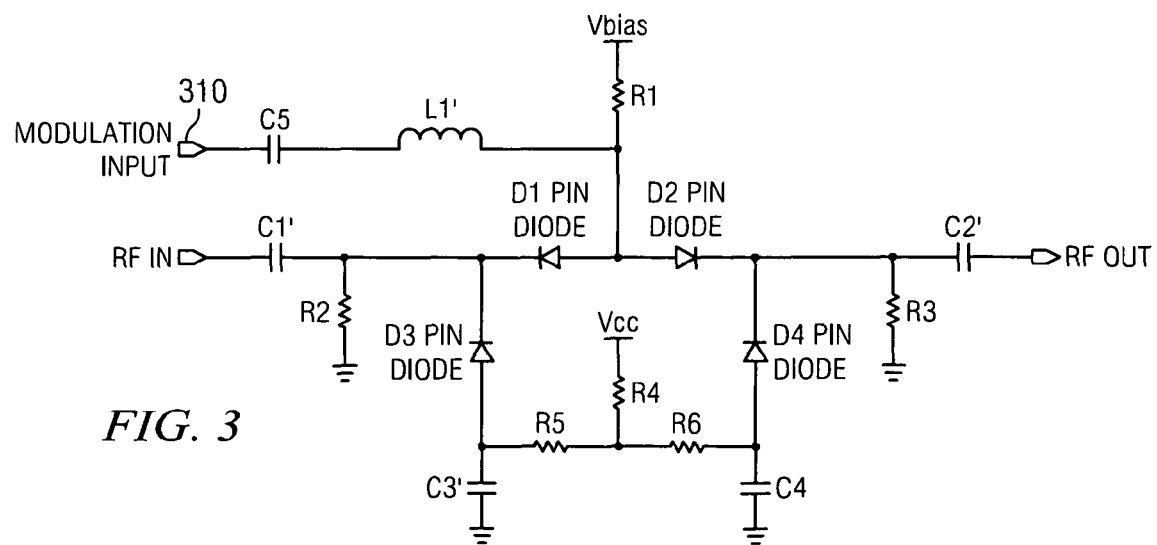
FIG. 3 is a schematic view of an exemplary broadband amplitude modulator, representing an embodiment of the invention.

FIG. 3 shows a simplified version of an exemplary broadband amplitude modulator. This circuit is a modified version of a PIN attenuator in which the attenuation is modulated by a signal applied to the modulation input 310. Diodes D1 through D4 are PIN diodes. When forward biased, these diodes act like current controlled resistors to RF modulation. The arrangement of the diodes and the bias network is such that the RF input and output impedance is not significantly affected by the attenuation or low frequency modulation of the attenuation. As amplitude modulation is a characteristic of slope efficiency modulation of the laser from a low frequency thermal or bias modulation, this circuit can be used to compensate for the resulting distortion.

Definitions

The term program and/or the phrase computer program are intended to mean a sequence of instructions designed for execution on a computer system (e.g., a program and/or computer program, may include a subroutine, a function, a procedure, an object method, an object implementation, an executable application, an applet, a servlet, a source code, an object code, a shared library/dynamic load library and/or other sequence of instructions designed for execution on a computer or computer system).

The term substantially is intended to mean largely but not necessarily wholly that which is specified. The term approximately is intended to mean at least close to a given value (e.g., within 10% of). The term generally is intended to mean at least approaching a given state. The term coupled is intended to mean connected, although not necessarily directly, and not necessarily mechanically. The term proximate, as used herein, is intended to mean close, near adjacent and/or coincident; and includes spatial situations where specified functions and/or results (if any) can be carried out and/or achieved. The term distal, as used herein, is intended to mean far, away, spaced apart from and/or non-coincident, and includes spatial situation where specified functions and/or results (if any) can be carried out and/or achieved. The term deploying is intended to mean designing, building, shipping, installing and/or operating.

The terms first or one, and the phrases at least a first or at least one, are intended to mean the singular or the plural unless it is clear from the intrinsic text of this document that it is meant otherwise. The terms second or another, and the phrases at least a second or at least another, are intended to mean the singular or the plural unless it is clear from the intrinsic text of this document that it is meant otherwise. Unless expressly stated to the contrary in the intrinsic text of this document, the term or is intended to mean an inclusive or and not an exclusive or. Specifically, a condition A or B is satisfied by any one of the following: A is true (or present) and B is false (or not present), A is false (or not present) and B is true (or present), and both A and B are true (or present). The terms a and/or an are employed for grammatical style and merely for convenience.

The term plurality is intended to mean two or more than two. The term any is intended to mean all applicable members of a set or at least a subset of all applicable members of the set. The term means, when followed by the term "for" is intended to mean hardware, firmware and/or software for achieving a result. The term step, when followed by the term "for" is intended to mean a (sub)method, (sub)process and/or (sub)routine for achieving the recited result. Unless otherwise defined, all technical and scientific terms used herein have the same meaning as commonly understood by one of ordinary skill in the art to which this invention belongs. In case of conflict, the present specification, including definitions, will control.

Conclusion

The described embodiments and examples are illustrative only and not intended to be limiting. Although embodiments of the invention can be implemented separately, embodiments of the invention may be integrated into the system(s) with which they are associated. All the embodiments of the invention disclosed herein can be made and used without undue experimentation in light of the disclosure. Although the best mode of the invention contemplated by the inventor(s) is disclosed, embodiments of the invention are not limited thereto. Embodiments of the invention are not limited by theoretical statements (if any) recited herein. The individual steps of embodiments of the invention need not be performed in the disclosed manner, or combined in the disclosed sequences, but may be performed in any and all manner and/or combined in any and all sequences. The individual components of embodiments of the invention need not be combined in the disclosed configurations, but could be combined in any and all configurations.

Various substitutions, modifications, additions and/or rearrangements of the features of embodiments of the invention may be made without deviating from the spirit and/or scope of the underlying inventive concept. All the disclosed elements and features of each disclosed embodiment can be combined with, or substituted for, the disclosed elements and features of every other disclosed embodiment except where such elements or features are mutually exclusive. The spirit and/or scope of the underlying inventive concept as defined by the appended claims and their equivalents cover all such substitutions, modifications, additions and/or rearrangements.

The appended claims are not to be interpreted as including means-plus-function limitations, unless such a limitation is explicitly recited in a given claim using the phrase(s) "means for" and/or "step for." Subgeneric embodiments of the invention are delineated by the appended independent claims and their equivalents. Specific embodiments of the invention are differentiated by the appended dependent claims and their equivalents.

REFERENCE(S)

[1] "Multielectrode DFB Laser for Pure Frequency Modulation and Chirping Suppressed Amplitude Modulation" Yoshikuni et al, J. Lightwave Technology, Vol. 5, p. 516 (1987)

What is claimed is:

1. An apparatus, comprising:
  a laser;
  at least one electrical predistortion circuit coupled to the laser; and
  an optical fiber coupled to the laser,
  wherein the laser is
    i) directly modulated
    ii) directly modulated with at least one member selected from the group consisting of low frequency thermal modulation and/or low frequency bias modulation to broaden a laser linewidth, increase stimulated Brillouin scattering threshold and/or reduce interferometric intensity noise and
    iii) directly modulated with at least one electrically predistorted signal containing one or more broadband signals to be transmitted, the one or more broadband signals to be transmitted being;
      a) higher in frequency than the low frequency thermal modulation and/or low frequency bias modulation and
      b) predistorted by at least one electrical predistortion circuit that distorts the one or more broadband signals to be transmitted in a manner that substantially cancels in-band intermodulation distortion generated by the one or more broadband signals to be transmitted mixing with the low frequency thermal and or bias modulation, in which mixing of the one or more broadband signals is an artefact of generation, transmission and/or receiving of an optical signal produced by the directly modulated laser, wherein the at least one electrical predistortion circuit includes a phase modulator that produces phase modulation to provide the distortion in the one or more broadband signals.

2. A hybrid fiber coax communications transmitter, comprising the apparatus of claim 1.

3. The apparatus of claim 1, wherein the at least one electrical predistortion circuit also predistorts the one or more broadband signals to be transmitted in such a manner that a received signal is substantially free from distortion due to the one or more broadband signals to be transmitted mixing with themselves.

4. The apparatus of claim 3, wherein the at least one electrical predistortion circuit includes a broadband electrical amplitude modulation circuit that amplitude modulates the one or more broadband signals to be transmitted in correlation with the low frequency thermal and/or bias modulation.

5. A hybrid fiber coax communications transmitter, comprising the apparatus of claim 3.

6. The apparatus of claim 3, wherein the at least one electrical predistortion circuit includes a broadband electrical phase modulator that produces phase modulation of the one or more broadband signals to be transmitted in correlation with the low frequency thermal and/or bias modulation.

7. The apparatus of claim 1, wherein the at least one electrical predistortion circuit includes a broadband electrical amplitude modulation circuit that amplitude modulates the one or more broadband signals to be transmitted in correlation with the low frequency thermal and/or bias modulation.

8. A method, comprising:
   directly modulating a laser that is coupled to an optical fiber;
   directly modulating the laser with at least one member selected from the group consisting of low frequency thermal modulation and/or low frequency bias modulation to broaden a laser linewidth, increase stimulated Brillouin scattering threshold and/or reduce interferometic intensity noise; and
   directly modulating the laser with at least one electrically predistorted signal containing one or more broadband signals to be transmitted, the one or more broadband signals to be transmitted being
      a) higher in frequency than the low frequency thermal and/or bias modulation and
      b) predistorted by at least one electrical predistortion circuit that distorts the one or more broadband signals in a manner that substantially cancels in-band intermodulation distortion generated by the one or more broadband signals to be transmitted mixing with the low frequency thermal and/or bias modulation, in which the mixing of the one or more broadband signals is an artifact of generation, transmission and/or receiving of an optical signal produced by the directly modulated laser.
   wherein the at least one electrical predistortion circuit includes a phase modulator that produces phase modulation to provide the distortion in the one or more broadband signals.

9. The method of claim 8, wherein the at least one electrically predistorted signal includes a broadband electrical amplitude modulation of the one or more broadband signals to be transmitted, in which at least a portion of the amplitude modulation is in correlation with the low frequency thermal and/or bias modulation.

10. The method of claim 8, wherein the at least one electrically predistorted signal is also distorted in a manner that substantially cancels in-band intermodulation distortion from the one or more broadband signals to be transmitted mixing with themselves.

11. The method of claim 10, wherein the at least one electrically predistorted signal includes a broadband electrical pulse modulation of the one or more broadband signals to be transmitted, in which at least a portion of the phase modulation is in correlation with the low frequency thermal and/or bias modulation.

12. The method of claim 10, wherein the at least one electrically predistorted signal includes a broadband electrical amplitude modulation of the one or more broadband signals to be transmitted, in which at least a portion of the amplitude modulation is in correlation with the low frequency thermal and/or bias modulation.

* * * * *